United States Patent [19]

Takagi et al.

[11] Patent Number: 4,800,459
[45] Date of Patent: Jan. 24, 1989

[54] CIRCUIT SUBSTRATE HAVING CERAMIC MULTILAYER STRUCTURE CONTAINING CHIP-LIKE ELECTRONIC COMPONENTS

[75] Inventors: Horshi Takagi; Yoshiaki Mori; Yukio Sakabe, all of Kyoto, Japan

[73] Assignee: Murata Manufacturing Co., Ltd., Japan

[21] Appl. No.: 119,674

[22] Filed: Nov. 12, 1987

[30] Foreign Application Priority Data

Nov. 12, 1986 [JP] Japan .................... 61-269238
Jan. 7, 1987 [JP] Japan ...................... 62-2428

[51] Int. Cl.⁴ .......................... H01G 4/10; H05K 1/18
[52] U.S. Cl. ....................................... 361/321; 361/401
[58] Field of Search ............... 361/328, 329, 330, 321, 361/395, 401

[56] References Cited

U.S. PATENT DOCUMENTS

| | | | |
|---|---|---|---|
| 2,777,110 | 1/1957 | Kodama | 361/328 X |
| 3,699,394 | 10/1972 | Schuler | 361/395 X |
| 3,784,878 | 1/1974 | Neu | 361/401 |
| 4,142,203 | 2/1979 | Dietz | 357/80 |
| 4,225,468 | 9/1980 | Donohue | 252/509 |
| 4,288,841 | 9/1981 | Gogal | 361/414 |
| 4,349,862 | 9/1982 | Bajorek et al. | 361/329 X |
| 4,451,869 | 5/1984 | Sakabe et al. | |
| 4,535,350 | 8/1985 | Goodrich et al. | 357/74 |
| 4,567,542 | 1/1986 | Shimada et al. | 361/321 |
| 4,585,580 | 4/1986 | Donohue | 252/517 |
| 4,608,592 | 8/1986 | Miyamoto | 357/80 |

FOREIGN PATENT DOCUMENTS

| | | |
|---|---|---|
| 023400 | 7/1980 | European Pat. Off. |
| 111890 | 12/1983 | European Pat. Off. |
| 166634 | 5/1985 | European Pat. Off. |
| 1162759 | 4/1967 | United Kingdom |
| 2044568 | 3/1979 | United Kingdom |
| 2077036 | 5/1981 | United Kingdom |
| 2135513 | 1/1984 | United Kingdom |

OTHER PUBLICATIONS

Electronic Ceramics, vol. 16 (74) Mar. 1985.
Electronic Ceramics, vol. 16 (75) May 1985.

Primary Examiner—Donald A. Griffin
Attorney, Agent, or Firm—Ostrolenk, Faber, Gerb & Soffen

[57] ABSTRACT

A circuit substrate (1) comprises a ceramic laminated structure (10) which has a plurality of ceramic layers (2–7) including ceramic layers (3–6) having cavities (44–49). Chip-like electronic components such as a laminated ceramic capacitor (26, 27) and a resistor (28) are received in the cavities. The chip-like electronic components are formed with external terminal electrodes (29–34) respectively. Conductors (15–20) are formed in through holes (35–43) provided in the ceramic layers and interfaces between adjacent pairs of the ceramic layers, to be connected to the external terminal electrodes. The external terminal electrodes are prepared from metal which is mainly composed of at least one of nickel, copper and palladium, and the conductors are prepared from metal which is mainly composed of copper.

14 Claims, 1 Drawing Sheet

CIRCUIT SUBSTRATE HAVING CERAMIC MULTILAYER STRUCTURE CONTAINING CHIP-LIKE ELECTRONIC COMPONENTS

BACKGROUND OF THE INVENTION

1. Field of the Invention

The present invention relates to a circuit substrate containing electrical elements such as capacitance, resistance and inductance elements, and more particularly, it relates to a circuit substrate which comprises a ceramic multilayer structure containing the aforementioned electrical elements formed by discrete chip-like electronic components. More specifically, the present invention relates to an improvement in conductive material for achieving electrical connection with respect to the chip-like electronic components.

2. Description of the Prior Art

In order to implement an electronic circuit with higher density and/or multiple functions, it is advantageous to provide a circuit substrate, on which various electronic components are mounted, with functions for serving as electrical elements such as a capacitor, a resistor and an inductor, in addition to a function of merely holding and interconnecting the electronic components. For example, a substrate consisting of a ceramic multilayer structure, i.e., a ceramic multilayer substrate, is suitable for satisfying the aforementioned requirement.

A report entitled "Multilayer Ceramic Substrate" by Susumu Nishigaki, *Electronic Ceramics*, Gakken-sha, Vol. 16 (75), May 1985, pp. 61–71 introduces various types of ceramic multilayer substrates. This reports roughly classifies ceramic multilayer substrates into those obtained by the "wet method" employing raw ceramic sheets, i.e., ceramic green sheets; and those obtained by the "dry method" employing fired ceramic plates, on the basis of their manufacturing methods, and further minutely classifies the multilayer substrates obtained by the "wet method" into "green sheet multilayer substrate" and "printed multilayer substrate".

The "green sheet multilayer substrate" is obtained by preparing a plurality of ceramic green sheets printed with thick films of dielectric or insulator paste, resistor paste and/or conductor paste as desired, laminating and pressurizing the green sheets and cofiring the same. Such a multilayer substrate can be formed with circuit elements such as a capacitor, a resistor and an inductor.

The "printed multilayer substrate" is obtained by repeating a process of preparing a green sheet printed with a thick film of resistor paste and/or conductor paste as desired, printing dielectric or insulator paste thereon and drying the same and again printing dielectric or insulator paste, resistor paste and/or conductor paste as desired.

The "dry method" is characterized in that a fired ceramic plate is employed to repeat the step of forming a resistor paste film and/or a conductor paste film thereon by thick film printing as desired, drying and firing the same and the step of forming an insulation layer by a similar method.

However, the aforementioned conventional methods or substrates obtained thereby have the following problems to be solved.

In a ceramic multilayer substrate obtained by the "wet method", including the "green sheet multilayer substrate" and the "printed multilayer substrate", the green sheets, the dielectric or insulator paste film, the resistor paste film and/or the conductor phase film are contracted and deformed, and hence it is difficult to obtain desired design characteristics such as the electrostatic capacitance value, the resistance value and the inductance value of the capacitor element, the resistor element and the inductor element, respectively, formed in the substrate. Particularly the method of manufacturing the "green sheet multilayer substrate" includes a pressurizing step in advance of firing, and the said deformation may also take place in the pressurizing step. Further, the "wet method" for obtaining the multilayer substrate includes a step of firing the ceramic green sheets simultaneously with the dielectric or insulator paste film, the resistor paste film and/or the conductor paste film. Thus, the resistor paste film and/or the conductor paste film as employed are also exposed to high temperature and to the atmosphere in firing. Consequently, the ceramic material for forming the ceramic green sheets or the dielectric paste film must be selected from those which can be fired at such a temperature and in such an atmosphere that the characteristics of the resistor paste and/or the conductor paste do not deteriorate, whereby the range of selection of employable ceramic materials is narrowed. In general, ceramic material which can be fired at a relatively low temperature has a small dielectric constant and hence it is difficult to form a capacitor element having large electrostatic capacitance. To the contrary, the resistor paste film must withstand the aforementioned firing of the ceramic material, and hence it is difficult to select a specific resistance of the resistor forming the resistance element over a wide range.

A specific problem of the "printed multilayer substrate" is that the flatness of the surface to be printed gradually deteriorates as the printing of the dielectric or insulator paste, the resistor paste and/or the conductor paste is repeated. Thus, it is difficult to increase the number of layers of the multilayer substrate. Consequently, it is difficult to render electrodes for forming capacitance in a capacitor element multi-layered, leading to difficulty in formation of a capacitor element having large capacitance in the multilayer substrate. Further, since the surface to be printed gradually loses its flatness, the position and the pattern of printing of the resistor paste and/or the conductor paste may not be obtained according to the desired design. The problem also makes it difficult to obtain the resistance value, the electrostatic capacitance value and the inductance value according to the desired design.

On the other hand, the "wet method" includes a printing step which is similar to the aforementioned method of obtaining the "printed multilayer substrate", and thereby confronts a problem substantially similar to the aforementioned problem specific to the "printed multilayer substrate".

SUMMARY OF THE INVENTION

Accordingly, an object of the present invention is to provide a ceramic multilayer substrate which can solve the aforementioned problems.

Provided according to the present invention is a circuit substrate which comprises:

a ceramic laminated structure provided with a plurality of ceramic layers including a first ceramic layer having a cavity, and having first and second major surfaces being opposite to each other;

a chip-like electronic component received in the cavity and having external terminal electrodes of metal mainly composed of at least one of nickel, copper and palladium; and electrical connection means, being formed by metal mainly composed of copper, connected to the external terminal electrodes and provided with a portion extending in the interior of the ceramic laminated structure.

Thus, according to the present invention, the ceramic multilayer structure contains a previously prepared discrete chip-like electronic component, to give the following advantages: The chip-like electronic component itself is not substantially deformed in a firing stage for obtaining the ceramic laminated structure and a pressurizing stage previous thereto, and hence the electrostatic capacitance value, the resistance value or the inductance value, for example, provided by the chip-like electronic component can be maintained substantially according to design. Further, the ceramic laminated structure has the cavity for receiving the chip-like electronic component, and hence the major surface of the ceramic laminated structure does not lose its flatness by containing the chip-like electronic component. Thus, the number of layers of the laminated structure can be increased without any problem. Further, a plurality of chip-like electronic components can be freely three-dimensionally arranged in the laminated structure while maintaining the aforementioned flatness of the major surface. If necessary, the chip-like electronic component can be arranged completely embedded in the interior of the ceramic laminated structure, whereby the chip-like electronic component can be improved in environmental resistance such as moisture resistance. Further, large electrostatic capacitance can be obtained, since a chip-like laminated ceramic capacitor can be employed in order to form a capacitor element.

In the present invention, it is further noted that the external terminal electrodes of the chip-like electronic component are made of metal which is mainly composed of at least one of nickel, copper and palladium and the electrical connection means is made of metal which is mainly composed of copper. Such materials are selected for the following reasons: External terminal electrodes of a chip-like electronic component have been generally made of silver. However, when an external terminal electrode made of silver and electrical connection means, to be connected to the external terminal electrode, made of copper are subjected to a high temperature, eutectic reaction takes place in a contact portion between silver and copper, to form a eutectic alloy which has an extremely low melting point. As the result, the eutectic alloy formed in the contact portion between the external terminal electrode and the electrical connection means flows out to cause electrically imperfect contact between the external terminal electrode and the electrical connection means. However, when the external terminal electrode and the electrical connection means are prepared from substantially identical metal which is mainly composed of copper, no imperfect contact is caused by flow of metal in the contact portion between the external terminal electrode and the electrical connection means even if the same are subjected to a high temperature. The said high temperature is applied to the external terminal electrode and the electrical connection means in a firing stage for obtaining the ceramic laminated structure. When, on the other hand, the external terminal electrode is prepared from metal mainly composed of nickel or palladium in place of copper, the melting temperature at the contact portion between the external terminal electrode and the electrical connection means is not lowered since nickel or palladium and copper form a complete solid solution system alloy. Thus, no metal flows out in the contact portion between the external terminal electrode and the electrical connection means similarly to the aforementioned case of the external terminal electrode made of copper, whereby no imperfect contact takes place in the contact portion.

According to the present invention, the chip-like electronic component can be previously manufactured as it is, and hence the material therefor and the method of manufacturing the same are in relatively wide allowable ranges. In a preferred embodiment of the present invention, a plurality of ceramic layers included in the ceramic laminated structure as formed of ceramic material which can be fired at a low temperature in a reducing atmosphere in order to prevent oxidation of copper, which may be contained in both of the external terminal electrodes and the electrical connection means, or copper contained only in the electrical connection means, under a high temperature. If the chip-like electronic component is a capacitor, it is preferable to employ dielectric composed of non-reducing ceramic, while a film of a non-reducing resistance component is preferably formed on a ceramic substrate when the chip-like electronic component is a resistor.

Further, if the chip-like electronic component is a laminated ceramic capacitor having an internal electrode, for example, such an internal electrode is preferably formed of metal mainly composed of at least one of nickel, copper and palladium. This is because nickel or palladium forms a complete solid solution system alloy with respect to copper, to cause no lowering in melting point at a contact portion between the internal electrode and an external terminal electrode. Thus, no melting of metal is caused in the contact portion between the internal electrode or external terminal electrode containing nickel or palladium, and the external terminal electrode or internal electrode containing copper, to cause no imperfect contact between the same. Further, when both of the external terminal electrode and the internal electrode are prepared from nickel, copper or palladium, no eutectic reaction, which may lower the melting point to cause the aforementioned imperfect contact, will take place since the external terminal electrode and the inner electrode are formed of substantially identical metal. If the external terminal electrode is prepared from palladium and the internal electrode is prepared from nickel, and vice versa, no lowering in melting point is caused in the contact portion similarly to the aforementioned case of combination of copper and nickel or palladium.

These and other objects, features, aspects and advantages of the present invention will become more apparent from the following detailed description of embodiments of the present invention when taken in conjunction with the accompanying drawings.

DESCRIPTION OF THE PREFERRED EMBODIMENTS

Figure 1:
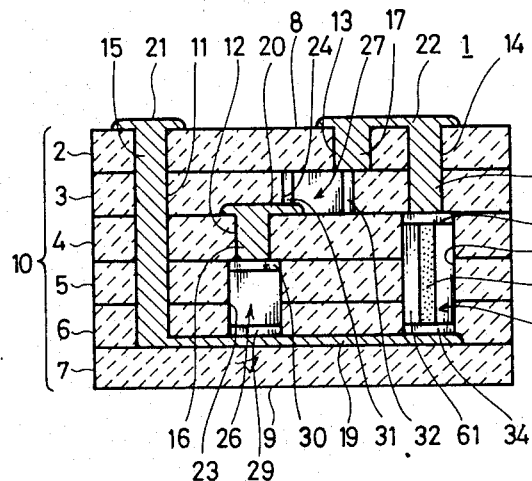
FIG. 1 is an enlarged sectional view illustrating a circuit substrate according to an embodiment of the present invention.

Referring to FIG. 1, the size of a circuit substrate 1 is considerably exaggerated in the perpendicular (thickness) direction as compared with the longitudinal (length) direction which is orthogonal thereto. The circuit structure 1 comprises a ceramic laminated structure 10 having a plurality of ceramic layers 2, 3, 4, 5, 6 and 7 and first and second major surfaces 8 and 9 which are opposite to each other.

Such a ceramic laminated structure 10 is provided with a plurality of electrical connection passages 11, 12, 13 and 14 which are defined by through holes formed in specific ones of the ceramic layers 2 to 6, so that conductors 15, 16, 17 and 18 are formed in the electrical connection passages 11, 12, 13 and 14 respectively. A conductor 19 is formed along the interface between the ceramic layers 6 and 7, to be electrically connected with the conductor 15. Another conductor 20 is formed along the interface between the ceramic layers 3 and 4, to be electrically connected with the conductor 16. Circuit patterns 21 and 22 are formed on the first major surface 8 of the ceramic laminated structure 10. The circuit pattern 21 is electrically connected with the conductor 15, and the circuit pattern 22 commonly connects the conductors 17 and 18.

The ceramic laminated structure 10 is further provided therein with spaces 23, 24 and 25, which are defined by cavities formed in specific ones of the ceramic layers 3 to 6 for receiving chip-like passive electronic components, for example. According to this embodiment, the spaces 23 and 24 receive chip-like laminated ceramic capacitors 26 and 27 respectively, and the space 25 receives a chip-like resistor 28. The laminated ceramic capacitor 26 has an external terminal electrode 29 which is electrically connected with the conductor 19 and another external terminal electrode 30 which is electrically connected with the conductor 16. The laminated ceramic capacitor 27 has an external terminal electrode 31 which is electrically connected with the conductor 20 and another external terminal electrode 32 which is electrically connected with the conductor 17. The resistor 28 has an external terminal electrode 33 which is electrically connected with the conductor 18 and an external terminal electrode 34 which is electrically connected with the conductor 19.

Figure 2:
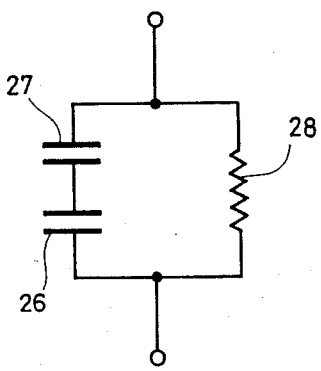
FIG. 2 is an equivalent circuit diagram implemented in the circuit substrate as shown in FIG. 1.

Thus, the circuit substrate as shown in FIG. 1 forms a circuit as shown in FIG. 2 between the circuit patterns 21 and 22.

Figure 3:
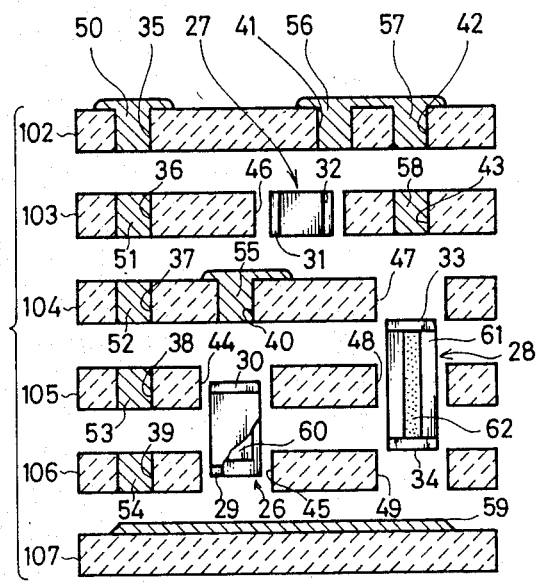
FIG. 3 is an exploded sectional view illustrating the assembly of the circuit substrate as shown in FIG. 1.

An exemplary method of manufacturing the circuit substrate 1 as shown in FIG. 1 is now described mainly with reference to FIG. 3. The ceramic layers 2 to 7 are provided by green sheets 102, 103, 104, 105, 106 and 107 of ceramic material which can be sintered at a low temperature in a reducing atmosphere. The green sheets 102 to 106 are formed in corresponding positions with through holes 35 to 39, which are aligned with each other to provide the aforementioned electrical connection passage 11. The green sheet 104 is formed with a through hole 40 providing the aforementioned electrical connection passage 12. The green sheet 102 is formed with a through hole 41 providing the aforementioned electrical connection passage 13. The green sheets 102 and 103 are formed in corresponding positions with through holes 42 and 43, which are aligned with each other to provide the aforementioned electrical connection passage 14.

The green sheets 105 and 106 are formed with holes perpendicularly passing through the same, to define cavities 44 and 45 which are aligned with each other to provide the aforementioned space 23. The green sheet 103 is formed with a hole perpendicularly passing through the same, to define a cavity 46 which provides the aforementioned space 24. The green sheets 104, 105 and 106 are formed with holes perpendicularly passing through the same, to define cavities 47, 48 and 49 which are aligned with each other to provide the aforementioned space 25.

Then, conductive paste members 50, 51, 52, 53, 54, 55, 56, 57 and 58, containing metal mainly composed of copper, are embedded in respective ones of the through holes 35 to 43 formed in the green sheets 102 to 106. In application of the conductive paste member 50, conductive paste is printed to extend toward one major surface of the green sheet 102 in order to simultaneously form the aforementioned circuit pattern 21. In application of the conductive paste member 55, conductive paste is printed to extend toward one major surface of the green sheet 104 in order to simultaneously form the aforementioned conductor 20. In application of the conductive paste members 56 and 57, conductive paste is printed to extend toward one major surface of the green sheet 102 in order to simultaneously form the aforementioned circuit pattern 22. Further, a conductive paste member 59 is printed on one major surface of the green sheet 107, in order to provide the aforementioned conductor 19.

The laminated ceramic capacitors 26 and 27 and the resistor 28 were previously completed ones. These elements are inserted in prescribed of the cavities 44 to 49 at least before the respective ones of the cavities 44 to 49 are closed by sequential lamination of the green sheets 102 to 107, for example.

The green sheets 102 to 107 laminated in the arrangement as shown in FIG. 3 are then pressurized and fired in a reducing atmosphere at a relatively low temperature. Thus, the circuit substrate 1 as shown in FIG. 1 is obtained.

In the aforementioned embodiment, the conductors 15 to 20 serving as electrical connection means are formed of metal which is mainly composed of copper. The external terminal electrodes 29 to 34 are formed of metal which is mainly composed of at least one of nickel, copper and palladium. As partially shown in FIG. 3, an internal electrode 60 of the laminated ceramic capacitor 26 is formed of metal which is mainly composed of at least one of nickel, copper and palladium. The resistor 28 is prepared by forming a resistance film 62 of a resistance component on a ceramic substrate 61, and the external terminal electrodes 33 and 34 are connected to both end portions of the resistance film 62.

The aforementioned green sheets 102 to 107 are formed of ceramic material which can be sintered at a low temperature in a reducing atmosphere, such as that described in *Electronic Ceramics* by Gakken-sha, Vol. 16 (74), March 1985, pp. 18-19. This substance employs ceramic powder of $Al_2O_3$, $CaO$, $SiO_2$, $MgO$, $B_2O_3$ and small additives as starting material. Such ceramic powder is mixed with a binder to form sheets of 200 $\mu m$ in thickness, for example, by the doctor blade method, thereby to obtain the green sheets 102 to 107. Characteristics for serving as dielectrics can be obtained in the green sheets 102 to 107 thus prepared, even if the same are fired in a reducing atmosphere such as a nitrogen atmosphere. Further, the green sheets 102 to 107 can be sintered at a relatively low temperature of about 900° to 1000° C.

Dielectrics included in the laminated ceramic capacitors 26 and 27 are formed of non-reducing ceramic material. The following compositions are examples of such non-reducing dielectric ceramic compositions;

(1) Non-reducing dielectric ceramic compositions in barium titanate dielectric ceramic compositions shown by the following composition formula:

$$\{(Ba_{1-x}Ca_x)O\}_m \cdot (Ti_{1-y}Zr_y)O_2,$$

wherein m, x and y are limited in the following ranges;

$$1.005 \leq m \leq 1.03,$$

$$0.02 \leq x \leq 0.22, \text{ and}$$

$$0 < y \leq 0.20.$$

(2) Non-reducing dielectric ceramic compositions in barium titanate dielectric ceramic compositions shown by the following composition formula:

$$\{(Ba_{1-x-y}Ca_xSr_y)O\}_m \cdot TiO_2,$$

wherein m, x and y are in the following ranges, respectively;

$$1.005 \leq m \leq 1.03,$$

$$0.02 \leq x \leq 0.22, \text{ and}$$

$$0.05 \leq y \leq 0.35.$$

(3) Non-reducing dielectric ceramic compositions in barium titanate dielectric ceramic compositions shown by the following composition formula:

$$\{(Ba_{1-x-y}Ca_xSr_y)O\}_m \cdot (Ti_{1-z}Zr_z)O_2,$$

wherein m, x, y and z are in the following ranges, respectively;

$$1.005 \leq m \leq 1.03,$$

$$0.02 \leq x \leq 0.22,$$

$$0.05 \leq y \leq 0.35, \text{ and}$$

$$0.00 < z \leq 0.20.$$

(4) Non-reducing dielectric ceramic compositions comprising $CaZrO_3$ and $MnO_2$ and having the following general formula:

$$Ca_xZrO_3 + yMnO_2,$$

wherein x of $Ca_xZrO_3$ ranges as follows and $MnO_2$ (=y) takes the following proportion of weight when the weight of $Ca_xZrO_3$ is taken as 1.00.

$$0.85 \leq x \leq 1.30$$

$$0.05 \leq y \leq 0.08 \text{ (proportion of weight)}$$

(5) Non-reducing dielectric ceramic compositions comprising $(BaCa)ZrO_3$ and $MnO_2$ and having the following general formula:

$$(Ba_xCa_{1-x})_yZrO_3 + zMnO_2,$$

wherein x and y of $(Ba_xCa_{1-x})_yZrO_3$ are in the following ranges and $MnO_2$ (=x) takes the following proportion by weight when the weight of $(Ba_xCa_{1-x})_yZrO_3$ is taken as 1.00.

$$0 < x \leq 0.20$$

$$0.85 \leq y \leq 1.30$$

$$0.005 \leq z \leq 0.08 \text{ (proportion by weight)}$$

U.S. Pat. No. 4,451,869 discloses the aforementioned non-reducing ceramic material, as well as a method of obtaining a laminated ceramic capacitor by employing such non-reducing ceramic material. The laminated ceramic capacitors 26 and 27 are thus formed with dielectrics of non-reducing ceramic material, so that the characteristics of the capacitors 26 and 27 do not deteriorate even if the same are placed in a reducing atmosphere in the stage of firing the green sheets 102 to 107.

The resistance film 62 of the resistor 28 is formed of a non-reducing resistance component. Such a non-reducing resistance component can be advantageously prepared from that disclosed in, for example, U.S. Pat. Nos. 4,225,468 and 4,585,580. Either patent discloses a non-reducing resistance component of resistance material such as boron lanthanum or boron yttrium and non-reducing glass. Such a non-reducing resistance component is applied on the ceramic substrate 61 and then fired in a reducing atmosphere, thereby to obtain the desired resistor 28. No characteristic deterioration is caused by employing such a resistor 28, even if the same is subjected to a reducing atmosphere in the stage of firing the green sheets 102 to 107.

Although the external terminal electrodes 29 to 34 are formed of metal mainly composed of at least one of nickel, copper and palladium and the conductors 15 to 20, serving as electrical connection means, are formed by metal mainly composed of copper in the aforementioned embodiment, other metals such as platinum, silver, nickel, palladium etc. may be added but only in a range that does not interfere with above-mentioned characteristics of nickel, copper or palladium. This also applies to the internal electrode 60.

The external terminal electrode 29 to 34 are formed by applying paste containing prescribed metal to the bodies of the chip-like electronic components 26 to 28 and firing the same. The firing step for obtaining the external terminal electrodes 29 to 34 may be simultaneously performed with the step of firing the green sheets 102 to 107. In other words, the external terminal electrodes 29 to 34 provided on the laminated ceramic capacitors 26 and 27 and the resistor 28 may be still in presintered states when the elements are inserted in the cavities 44 to 49 in the step of laminating the green sheets 102 to 107.

It is to be noted that the circuit substrate 1 as shown in FIG. 1 is a mere example for simply illustrating the present invention. Therefore, the type, the number and the mode of connection of chip-like electronic components employed in the inventive circuit substrate may be arbitrarily changed according to the type of circuit desired. Although the cavities for receiving the chip-like electronic components are defined by the through holes provided in the ceramic layers forming the laminated ceramic structure in the aforementioned embodiment, such cavities may also be defined by recesses not passing through the ceramic layers.

What is claimed is:

1. A circuit substrate comprising:
   a ceramic laminated structure comprising a plurality ceramic layers including a first ceramic layer which defines a cavity, said laminated structure having first and second major surfaces opposite to each other;
   a chip-like electronic component having external terminal electrodes and being received in said cavity; and
   electrical connection means connected to said external terminal electrodes and having a portion extending from said first major surface and into said cavity which is in the interior of said ceramic laminated structure,
   said external terminal electrodes being mainly composed of at least one metal selected from the group consisting of nickel, copper and palladium,
   said electrical connection means being metal and mainly composed of copper; and
   said electrical connection means including a conductive material member extending to said cavity along the interface between an adjacent pair of ceramic layers selected from said plurality of ceramic layers.

2. A circuit substrate in accordance with claim 1, wherein
   said chip-like electronic component further comprises an internal electrode which is mainly composed of at least one metal selected from the group consisting of nickel, copper and palladium.

3. A circuit substrate in accordance with claim 2, wherein
   said chip-like electronic component includes a laminated ceramic capacitor.

4. A circuit substrate in accordance with claim 1, wherein
   said ceramic laminated structure has a second ceramic layer which defines said first major surface and has a first through hole which accommodates said electrical connection means.

5. a circuit substrate in accordance with claim 4, wherein
   said electrical connection means includes a conductive material member formed in said first through hole.

6. A circuit substrate in accordance with claim 5, wherein
   said first ceramic layer has a second through hole and said electrical connection means includes a conductive material member formed in said second through hole.

7. A circuit substrate in accordance with claim 1, wherein
   said ceramic laminated structure has a third ceramic layer having no cavity, said third ceramic layer defining said second major surface.

8. A circuit substrate in accordance with claim 1, wherein
   said first ceramic layer is located in an intermediate position in said plurality of ceramic layers included in said ceramic laminated structure.

9. A circuit substrate in accordance with claim 1, wherein
   said cavity includes a hole perpendicularly passing through said first ceramic layer.

10. A circuit substrate in accordance with claim 1, wherein
    said electrical connection means includes a conductive film extending on said first major surface of said ceramic laminated structure.

11. A circuit substrate in accordance with claim 1, wherein
    said plurality of ceramic layers included in said ceramic laminated structure comprise ceramic material which can be sintered at a low temperature in a reducing atmosphere.

12. A circuit substrate in accordance with claim 11, wherein
    said chip-like electronic component includes a capacitor having a dielectric portion comprising a non-reducing ceramic.

13. A circuit substrate in accordance with claim 11, wherein
    said chip-like electronic component includes a resistor having a film comprising a non-reducing resistive component formed on a ceramic substrate.

14. A circuit substrate comprising:
    a ceramic laminated structure comprising a plurality of ceramic layers including a first ceramic layer which defines a cavity, said laminated structure being first and second major surfaces opposite to each other;
    a chip-like electronic component having external terminal electrodes and being received in said cavity; and
    electrical connection means connected to said external terminal electrodes and having a portion extending from said first major surface and into said cavity which is in the interior of said ceramic laminated structure,
    said external terminal electrodes being mainly composed of at least one metal selected from the group consisting of nickel, copper and palladium,
    said electrical connection means being metal and mainly composed of copper; and wherein
    said first ceramic layer defines said first major surface and has a first through hole defining said cavity,
    said ceramic laminated structure has a second ceramic layer having a second through hole corresponding to said first through hole, and a third ceramic layer having no cavity and defining said second major surface, and
    said electrical connection means includes a first conductive material member extending to said cavity along the interface between an adjacent pair of ceramic layers selected from said plurality of ceramic layers and a second conductive material member formed in said first and second through holes.

* * * * *

UNITED STATES PATENT AND TRADEMARK OFFICE
CERTIFICATE OF CORRECTION

PATENT NO. : 4,800,459
DATED : January 24, 1989
INVENTOR(S) : Hiroshi Takagi et al It is certified that error appears in the above-identified patent and that said Letters Patent is hereby corrected as shown below:

On the title page Item (75) Inventors, "Horshi" should read --Hiroshi--.

Signed and Sealed this

First Day of August, 1989

Attest:

DONALD J. QUIGG

Attesting Officer

Commissioner of Patents and Trademarks